(12) United States Patent
Nishihara et al.

(10) Patent No.: US 6,242,991 B1
(45) Date of Patent: *Jun. 5, 2001

(54) SURFACE ACOUSTIC WAVE FILTER HAVING A CONTINUOUS ELECTRODE FOR CONNECTION OF MULTIPLE BOND WIRES

(75) Inventors: Tokihiro Nishihara; Yoshio Satoh; Hidema Uchishiba; Takashi Matsuda; Osamu Ikata, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/244,993

(22) Filed: Feb. 4, 1999

Related U.S. Application Data

(62) Division of application No. 08/640,948, filed as application No. PCT/JP95/02293 on Nov. 10, 1995, now Pat. No. 5,955,933.

(30) Foreign Application Priority Data

Nov. 10, 1994 (JP) .................................... 6-276238

(51) Int. Cl.$^7$ ............................. H03H 9/64; H03H 9/25
(52) U.S. Cl. ..................... 333/193; 333/195; 310/313 B
(58) Field of Search ................................ 333/193–196; 310/313 R, 313 B, 313 C, 313 D

(56) References Cited

U.S. PATENT DOCUMENTS

| | | | |
|---|---|---|---|
| 4,166,258 | 8/1979 | Tseng | 333/195 |
| 4,365,219 | 12/1982 | Nathan | 333/193 |
| 4,420,730 | 12/1983 | Wakatsuki et al. | 333/195 |
| 4,542,356 * | 9/1985 | Nakazawa et al. | 333/195 |
| 4,580,115 | 4/1986 | Sprengel | 333/194 |
| 4,682,130 | 7/1987 | Bulst et al. | 333/195 |
| 4,683,394 | 7/1987 | Koshino | 310/313 R |
| 4,734,664 | 3/1988 | Hikita et al. | 333/193 |

(List continued on next page.)

FOREIGN PATENT DOCUMENTS

| | | |
|---|---|---|
| 0 176 786 | 4/1986 | (EP) . |
| 52-19044 | 2/1977 | (JP) . |
| 56-57526 | 5/1981 | (JP) . |

(List continued on next page.)

OTHER PUBLICATIONS

Copy of Japanese Patent Office Action dated Apr. 18, 2000 for Japanese Patent Application 8–515203 with English translation.

*Primary Examiner*—Robert Pascal
*Assistant Examiner*—Barbara Summons
(74) *Attorney, Agent, or Firm*—Armstrong, Westerman, Hattori, McLeland & Naughton, LLP

(57) ABSTRACT

In A surface acoustic wave filter constituted with a ladder of resonators having a resonance frequency or an anti-resonance frequency, an input current flowing into a resonator in a parallel arm at the first stage from the input is so large as to deteriorate its lifetime caused from a heat generation by the resistance of the thin film wiring. As a measure to this problem, bonding wires (30, 31) connected onto points on connection electrodes (130, 131) for connecting an end of each of plural comb teeth electrodes 111 forming the resonators $R_{s1}$ & $R_{p1}$, or on a lead conductor (103-1) extended longitudinally from the connection electrode, are allotted at both sides of a center line (C1) of the plural comb teeth electrode group. Furthermore, a bonding wire may be connected substantially onto the center line C1 as well. It is preferable for the bonding wires to be located substantially symmetric with respect to the center line C1. It is preferable that the width along the longitudinal direction of the comb teeth electrodes is lager than a width of the comb teeth electrode.

27 Claims, 11 Drawing Sheets

INPUT SIDE

U.S. PATENT DOCUMENTS

| | | | |
|---|---|---|---|
| 5,162,822 | 11/1992 | Wakamori | 333/193 |
| 5,374,908 | 12/1994 | Wright | 333/195 |
| 5,506,552 * | 4/1996 | Seki et al. | 333/195 |
| 5,559,481 * | 9/1996 | Satoh et al. | 333/194 X |
| 5,561,406 * | 10/1996 | Ikata et al. | 333/193 X |
| 5,945,893 * | 8/1999 | Plessky et al. | 333/193 X |

FOREIGN PATENT DOCUMENTS

| | | | |
|---|---|---|---|
| 58-131810 * | 8/1983 | (JP) | 333/193 |
| 59-21114 | 2/1984 | (JP) . | |
| 60-127813 * | 7/1985 | (JP) | 333/193 |
| 62-6509 * | 1/1987 | (JP) . | |
| 62-47206 * | 2/1987 | (JP) | 333/195 |
| 62-142409 | 6/1987 | (JP) . | |
| 63-13512 * | 1/1988 | (JP) | 333/195 |
| 3-89709 * | 4/1991 | (JP) | 333/193 |
| 02060953 | 11/1991 | (JP) . | |
| 3-229507 * | 11/1991 | (JP) . | |
| 3-263909 * | 11/1991 | (JP) | 333/193 |
| 3-284006 | 12/1991 | (JP) . | |
| 4-23444 | 4/1992 | (JP) . | |
| 5-7125 * | 1/1993 | (JP) | 333/193 |
| 5-95245 * | 4/1993 | (JP) | 333/193 |
| 5-275965 | 10/1993 | (JP) . | |
| 6-053775 | 2/1994 | (JP) . | |
| 6-61782 * | 3/1994 | (JP) | 333/193 |
| 6-164309 * | 6/1994 | (JP) | 333/193 |
| 6-188673 | 7/1994 | (JP) . | |
| 7-193450 * | 7/1995 | (JP) . | |
| 62-284509 | 1/1999 | (JP) . | |

* cited by examiner

INPUT SIDE

INPUT SIDE

INPUT SIDE

SURFACE ACOUSTIC WAVE FILTER HAVING A CONTINUOUS ELECTRODE FOR CONNECTION OF MULTIPLE BOND WIRES

This application is a divisional application of U.S. patent application Ser. No. 08/640,948 filed May 15, 1996 now U.S. Pat. No. 5,955,933, which is a 371 of International Application No. PCT/JP95/02293, filed Nov. 10, 1995.

BACKGROUND OF THE INVENTION

1. Field of the Invention

The present invention relates to a surface acoustic wave filter of a ladder type, especially to an improvement of its power-withstanding characteristics.

2. Description of the Related Art

Recently, the market of mobile communication apparatus represented by, for example, portable telephones are rapidly expanding, and the demand for small and efficient parts to be used in these apparatus has become strong. Because the high power-withstanding characteristic is required in an antenna switch located in a front end of radio frequency circuit of the mobile communication terminal, there has been conventionally employed a dielectric filter. However, in order to make the apparatus further smaller it is necessary to replace the dielectric filter with a surface acoustic wave (referred to hereinafter as a SAW) filter. On the other hand, width of electrodes of the SAW filter becomes minute as the operation frequency rises; accordingly, further power-withstanding characteristic has come to be required.

The SAW filter of a ladder type is a filter in which SAW resonators having mutually different resonance characteristics (single-pair terminal resonator) are arranged in the parallel arm and in the series arm, where insertion loss can be decreased very much owing to the use of this ladder type SAW filter compared with the case using a SAW filter of a transversal type in which the comb teeth electrode pair is connected in multiple stages. Details of the SAW resonator will be explained later.

Impedance of the resonator is zero at the resonance frequency fr, and is maximum at the antiresonance frequency fa. On the contrary, the admittance is maximum at the resonance frequency fr, and is zero at the antiresonance frequency fa. That is, the resonator is tuned in two ways.

Such resonators are connected in an L shape arrangement so as to constitute a two-pair terminal resonator, where the resonance frequency of resonator Rp in the parallel arm and resonator Rs in the series arm are set such that the antiresonance frequency faP of resonator Rp of the parallel arm conforms substantially to the resonance frequency frs of resonator Rs in the series arm, Whereby, there is formed a band-pass filter having a center frequency which is the resonance frequency frs of resonator Rs in the series arm. Then, a band-pass filter characteristic which satisfies the specification, such as of portable telephones, is accomplished by connecting the two-pair terminal resonators in multiple stages to form a ladder structure as shown in an equivalent circuit of FIG. 3A.

When the SAW filter is built in a radio frequency circuit, such as of portable telephones, an electric power withstanding characteristic is required corresponding to the maximum transmitting power of the apparatus. A consideration to Joule heat is severely required, particularly in the use in an antenna duplexer (a transmitter/receiver switch) to which the transmitting power output from the output amplifier stage is applied. The antenna duplexer is a device for sharing the antenna by transmitter and receiver by the utilization of the difference between the transmitting frequency and the receiving frequency, and consists of a transmitter band-pass filter in which the transmitting frequency band is in the pass-band and a receiver band-pass filter in which the receiving frequency band is in the pass-band.

In the prior art SAW filter, there was a problem in that the temperature rose in the filter chip which formed the resonator and the characteristic was apt to deteriorate when a signal was input at an attenuation band (a stop band) which is at the lower frequency side in the filter characteristic (bandpass characteristic). That is, power-withstanding characteristics at the attenuation band at the lower frequency side was low compared with power withstanding characteristics at other frequency bands.

Therefore, when an antenna duplexer employed in, for instance, AMPS (Automatic Message Processing System), which is an analog portable telephone system, adopted in North America and South America, was composed of a prior art SAW filter, the receiver filter, to which the signal of the frequency band (transmitting signal) having low power-withstanding characteristics was input, was deteriorated earlier than the transmitting filter, because the transmitting frequency (824–849 MHz) is lower than the receiving frequency (869–894 MHz).

On the other hand, the current route varies depending on the input signal frequency as shown in FIG. 2, which schematically illustrates the relation between the filter characteristic and the current routes in the SAW filter. That is, in principle, the signal current of the frequency of pass band A flows in the series arm, and the signal current of the frequency of attenuation band B1 at the lower frequency side flows chiefly in the parallel arm. The signal at the high frequency side attenuation band B2 hardly flows into any resonator in the filter.

Moreover, when the currents in each stage are compared in the ladder type filter, the currents become smaller in the order going from the first stage at the input side to the latter stage. That is, the relations are expressed by formulas (1) and (2), where the currents flowing in each resonator RS1, RS2, Rp1, Rp2 and Rp3 are Is1, Is2, Ip1, Ip2, and Ip3, respectively, as shown in FIG. 3A.

$$Is1 > Is2 \tag{1}$$

$$Ip1 > Ip2 > Ip3 \tag{2}$$

Therefore, it is considered that the decrease in the Joule heat caused from the current Ip1 flowing in resonator Rp1 of the parallel arm at the input side first stage is especially effective in improving the power withstanding characteristics of attenuation band B1 at the lower frequency side.

Here, impedance Z of resonator Rp1 is represented by formula (4) according to FIG. 3(B).

$$Z = Z1 * Z2/(Z1+Z2) \tag{4}$$

where $Z1 = -j/\omega C_0$ and
$Z2 = R + j\omega L - j/\omega C_1$

And, resistance element Zr (real part of impedance Z) involved in the Joule heat is shown by the formula (5).

$$Zr = R/(\omega C_0)^2 [R^2 + (\omega L - 1/\omega C_0 - 1/\omega C_1)^2] \tag{5}$$

In resistance element Zr, resistance R can be decreased by appropriately selecting opening width x of comb teeth electrodes 111 shown in FIG. 1 and the number of the pairs (Japanese Provisional Patent Publication HEI6-29779).

However, it was confirmed by the present inventors that the resistance of the wiring conductor formed with a thin film largely took part in the heating of the filter chip according to the below-described experiments.

In the parallel arm of the input side first stage, actual resistance element ZR1 which contributes to the heating of the filter chip is represented by formula (6). R1 in formula (6) is resistance of the part between the resonator and the bonding wire in the above-mentioned wiring conductor.

$$ZR1=Zr+R1 \quad (6)$$

DISCLOSURE OF THE INVENTION

The present invention is derived from the above-mentioned consideration, and aims at enhancing of the reliability of the present SAW filter resulted from the reduction of the heat generation at a thin film conductor between a resonator and a bonding wire, particularly of a resonator in the parallel arm at the input stage, so as to suppress the temperature rise of the resonator whereby its power-withstanding characteristics is improved.

In the surface acoustic wave filter constituted with a ladder of resonators having a resonance frequency or an anti-resonance frequency, bonding wires (30, 31) are connected to positions on connection electrodes for connecting an end of each of plural comb teeth electrodes 111 forming the resonators $R_{s1}$ & $R_{p1}$, or to a lead conductor extended longitudinally from the connection electrode, where the positions are allotted at both sides of a center line C1 of the plural comb teeth electrode group. The bonding wire may be further connected substantially onto the center line C1, too. It is preferable that the bonding wires are located substantially symmetric with respect to the center line C1. It is preferable that a width b, along the longitudinal direction of the comb teeth electrode, of the connection electrode 130, 131 is larger than a width w of the comb teeth electrode. Or, a bonding wires 33' is connected onto a point within the length L of the connection electrode 130' at the ground side of the resonator, preferably onto a point in the vicinity of the center line c1. Lead conductors 130-1 may be extended longitudinally from both ends of the connection electrode.

Moreover, plural projections 130-3 are projected from the connection electrode in a direction opposite from the comb teeth electrodes, at points on the connection electrode or on the lead conductor 130-1 extending longitudinally from the connection electrode, where the points are allotted on both the sides of the center line, and the bonding wires 33' are connected onto the projections 130-3, respectively. A space 130-4 between the projections 130-3 may be filled with an electrically conductive material. The above-mentioned bonding wire connecting structure can be applied solely to a SAW resonator.

Or, the thickness of the connection electrodes 130, 130' and 131 together with its lead conductor 130-1 is formed thicker than the thickness of the comb teeth electrodes.

In each parallel arm the electrical resistance of the connection electrode itself and the electrical resistance on the way to the bonding wire are reduced so as to suppress Joule heat generation, whereby temperature rise of the resonator is suppressed.

THE BEST MODE TO EMBODY THE INVENTION

Figure 1:
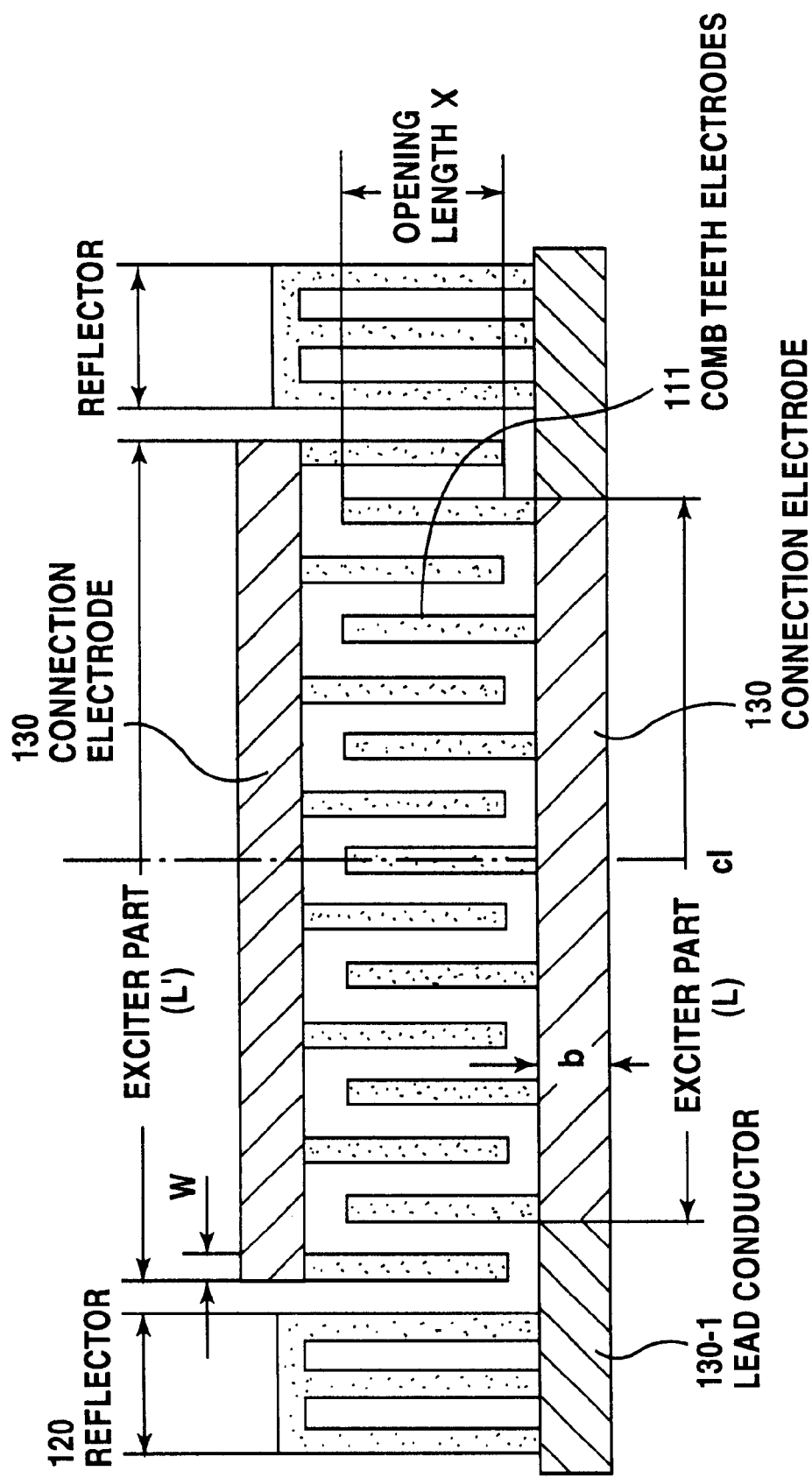
FIG. 1 is a plane view showing the structure of the SAW resonator.
Figure 2:
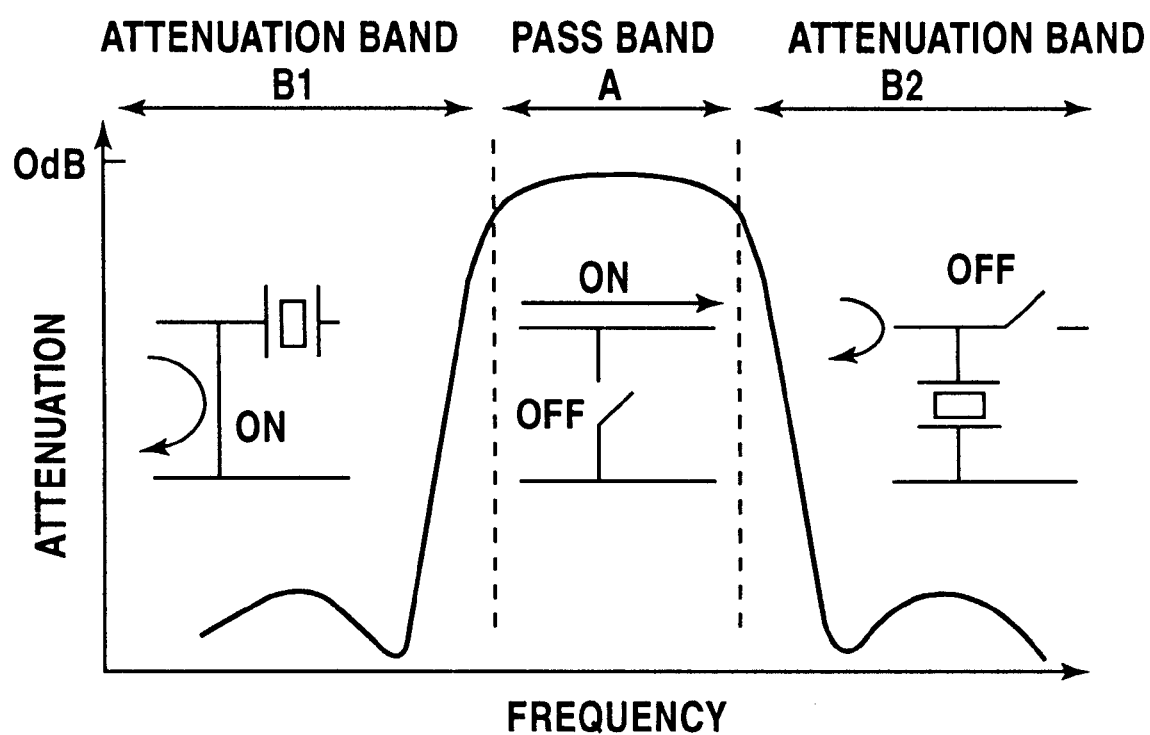
FIG. 2 schematically illustrates the relation between the filter characteristic and the current route.

In FIG. 1 is shown a plane view of an example of an electrode structure used commonly for SAW resonator Rp and Rs in the parallel arm and the series arm of the ladder type structure.

The SAW resonator (referred to hereinafter simply as resonator) is constituted with a plurality of comb teeth electrodes 111 inserted into between a plurality of comb teeth electrodes opposed thereto so as to form a pair, an exciter part to connect the comb teeth electrodes' open ends with connection electrode 130, and reflectors 120 arranged on both the sides of the above-mentioned comb teeth electrode pairs along the direction of propagation of the surface acoustic wave. The above-mentioned excitation part becomes an input/output terminal for the excitation as well as the reception. The reflector of the example in FIG. 1 is formed with a plurality of comb teeth electrodes where the open ends are mutually short-circuited. The comb teeth electrodes or strip array electrodes, each of an open end type, can be employed as the reflector. Though the reflector is drawn to be electrically connected to the exciter part with 1 lead conductor 130-1, the reflector may be composed without the connection on demand from the characteristic design of the filter.

Conductor patterns of each resonator RS1, RS2 and Rp1 to Rp3, which are comb teeth electrodes and reflectors, and other wiring conductors consist of a thin film conductor of three-layer structure of Al-2%Cu(125 nm)/Cu(45 nm)/Al-2%Cu(125 nm). Resonators RS1, RS2 and Rp1 to Rp3 are designed to meet the specification of the receiver filter of AMPS (AMPS-Rx: receiving band 869–894 MHz).

Figure 4:
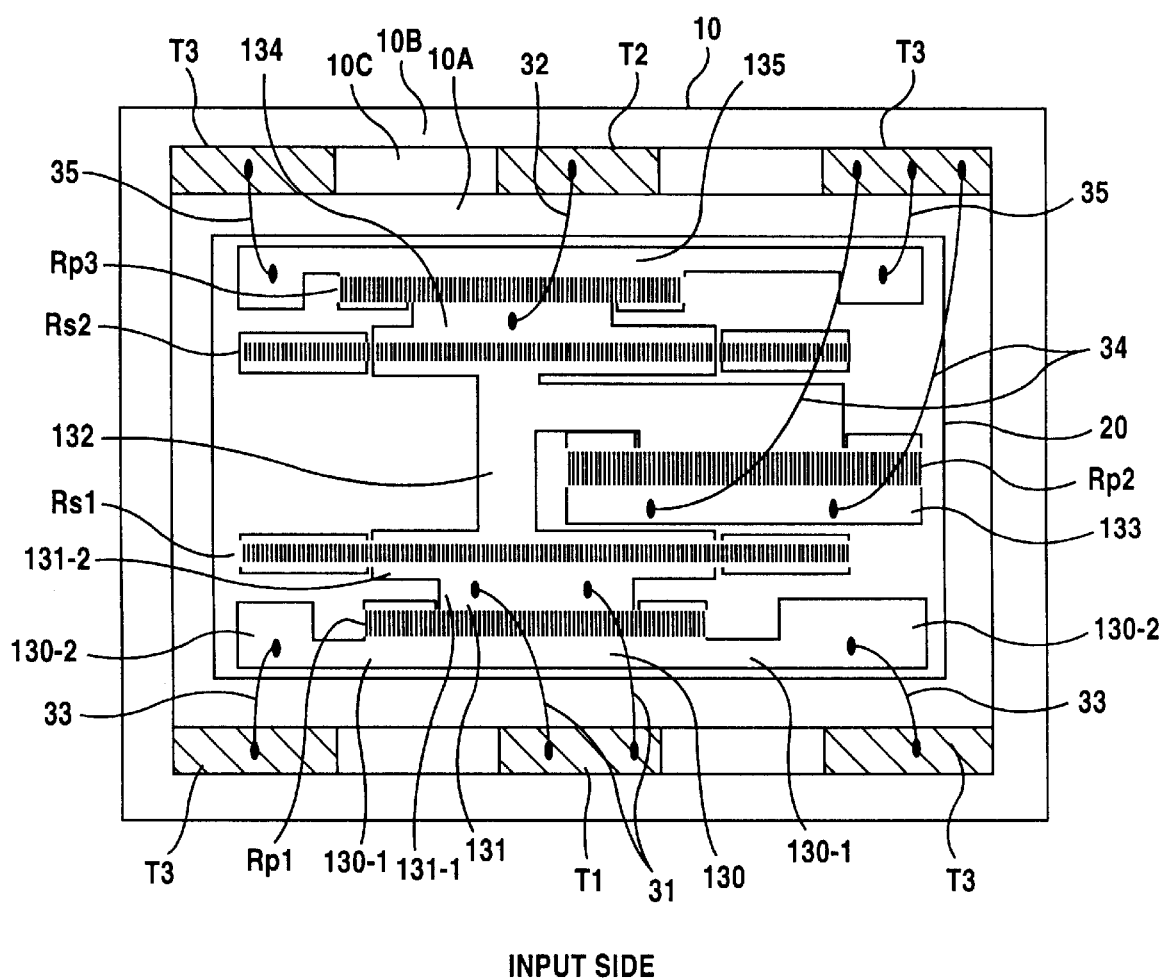
FIG. 4 is a plane view of the first preferred embodiment of the SAW filter of the present invention.

SAW filter 1 is composed of a package 10 made of ceramic of about several milli-meter square, a filter chip 20 bonded to the inner surface of the bottom 10A of package 10, bonding wires 31 to 35, etc. which consist of Au wire or Al wire of, for instance 25 μmφ as shown in FIG. 4.

Package 10 is provided with bonding tables 10C along two opposed sides in frame sidewall 10B. Upon the surfaces of the bonding tables 10C are provided external connection terminals T1 to T3 which consist of Au films, for example.

Filter chip 20 is such that a thin film conductor of a predetermined pattern, which will be separately explained later, is provided on a single-crystal substrate of 36° rotation, Y-cut, X-propagation LiTaO3 (tantalic acid lithium), and is made according to a conventionally known process.

In filter chip 20 are formed two resonators RS1 & RS2 which are the structural elements of the series arm, and three resonators Rp1, Rp2 & Rp3 which are the structural elements of the parallel arms in the ladder type filter, and predetermined wiring conductors including the bonding pad. Totally five resonators RS1, RS2 and Rp1 to Rp3 are arranged so as to shift mutually in the vertical direction of FIG. 4 so that the propagation path of each surface acoustic wave should not mutually interfere.

In the resonator shown in FIG. 1, width w of the comb teeth electrodes in the exciter part is about 1.2 $\mu$m, length is about 81 $\mu$m, and the number of comb teeth is 58 pairs.

Connection electrodes 130 for connecting the comb teeth electrodes have a width to connect all the comb teeth electrodes for the excitation, that is, a length L (L') in the direction of the SAW propagation, and have a width b in the direction of length of comb teeth, that is in its right-angled direction. The length L (L') is about 278 $\mu$m, the width b is about 80 $\mu$m, and the thickness is about 300 nm as mentioned above. The value b of the width is large enough compared with width w of the comb teeth.

Resonator Rp1 of the parallel arm on the input side has a structure shown in FIG. 1, where pads 130-2 are provided respectively at open ends of lead conductor 130-1 along the direction of the length of the connection electrode 130, that is, in direction of the array of the comb teeth electrode group 111 as shown in FIG. 4; and thereon are respectively connected bonding wires 33 by a method of widely used supersonic wave, etc. so as to connect to ground terminals T3. That is, they are connected to two points allotted by a center line C1 of the exciter. Connection conductor 131 is connected as well on the input exciter side of resonator Rp1 of a parallel arm similarly to conductor 130, where lead conductor 131-1 having its entire length as the width of the exciter part extends to connection electrode 131-2 of an input stage resonators RS1 of the series arm. Two bonding wires 31 are connected to the points, allotted by center line C1 of the resonator, on this lead conductor 131-1 so as to connect to signal input terminal T1.

The output side of resonator RS1 of the input stage of the series arm, the input side of resonator RS2 of the series arm of the second stage, and the input sides of resonator Rp2 of a parallel arm of the second stage are mutually connected by thin film wiring 132. Each resonator is provided with a connection electrode for connecting thin film wiring 132 to each resonator in the similar way to connection electrode 130; however, they are not particularly shown in the figure. Connection electrode 133 is provided on the ground side of resonator Rp2 of the parallel arm of the second stage similarly to connection electrode 130, and two bonding wires 34 are welded at the points allotted by a center line of connection electrode so as to connect to ground terminal T3 similarly to connection electrode 130. The ground side of resonator Rp3 of the parallel arm of the third stage is connected to ground terminal T3 via two bonding wires 35 similarly to the connection of connection electrode 130, lead conductor 130-1 and pad 130-2.

It was explained that the locations of two bonding wires 33 welded on ground sides of resonator Rp1 of the input side first stage were allotted to both the sides of center line C1 in the direction of length L of connection electrode 130.

However, in order to decrease electrical resistance it is further preferable that the welding points are located at symmetric positions with respect to center line c1 of connection electrode 130 of resonator Rp1, that is, apart at substantially equal distances in mutually opposite directions.

In order to confirm the problem of the above-mentioned prior art technology and to confirm the effect of the structure of the invention, there were made six kinds of samples 1A to 1F in which the bonding positions were varied as shown in FIG. 6A to FIG. 6F, where the connection electrode on the ground side of resonator Rp1 of the parallel arm of the input stage, the lead conductor connected thereto, the number of bonding wires connected thereto, and their positions are varied. In each sample 1A to 1F, the bonding positions of resonators Rp2 and Rp3 other than the ground side of the first stage are the same. In each sample, the thickness of the lead conductor and connection electrode are about 300 nm and the width is about 80 $\mu$m. Temperature and power withstanding characteristics were respectively measured.

The sample 1A and 1B are of the structure of prior art technology. In samples 1A and 1B, the bonding wire is connected to an end of lead conductor 30 extended from the connection electrode of resonator Rp1. The bonding wire is one in sample 1A, and three in sample 1B.

Sample 1C to 1F are of the structure which can be embodied in the present invention. In sample 1C, a single bonding wire is connected on center line c1, that is a central part, of connection electrode of resonator Rp1. In sample 1D, a single bonding wire is connected to both ends of resonator Rp1, respectively. The bonding positions are symmetry with respect to center line c1. Sample 1E is of a structure almost similar to FIG. 4. Lead conductor 130-1 is provided to extend to both the sides of connection electrode 130 along its longitudinal direction. Welding positions of the two bonding wires are on lead conductor 130-1 respectively substantially 150 $\mu$m outside from the edge of the comb teeth electrode group.

In sample 1F, totally three bonding wires are connected one by one to the center part and to both the ends of resonator Rp1 respectively, where the bonding positions are symmetry with respect to center line c1.

These samples 1A to 1F were placed in a thermostatic oven, where the environmental temperature was kept at 85° C., and a constant power (for instance, an initial value 1 W) was applied thereto while changing the frequency by 1 MHz within the range of 340 to 930 MHz. Afterwards, the filter characteristic was measured after the power application had been terminated. If there was no characteristic deterioration, the applied electric power was further incremented by 0.1 W so as to carry out the same measurements. Applied power at which the deterioration of the filter characteristic became remarkable as described below was defined as the value of the withstanding power. That is, the applied electric power at which the decrease in the band width of the pass band reached 2 MHz or deterioration in the attenuation pole of the low frequency side reached 5 dB was defined as the value of the withstanding power.

Concurrently to the measurement of the filter characteristic was measured the temperature of filter chip 20 (chip temperature) by converting the resistance value of a conductor pattern of a mianda provided in the neighborhood of resonator Rp1 into a temperature value.

Values of the withstanding power of each sample 1A to 1F, real part ZR1 of the impedance of the parallel arm at the frequency at the attenuation pole of the low frequency side, and the temperature of the chip (with 1.3 W input) are collectively shown in Table 1.

TABLE 1

| Sample | Real Part of the Imped. [Ω] | Chip Temp. [° C.] | Withstand Power [W] |
| --- | --- | --- | --- |
| 1A | 5.67 | 123.6 | 1.4 |
| 1B | 5.68 | 137.5 | 1.4 |
| 1C | 2.43 | 106.0 | 1.8 |
| 1D | 2.71 | 104.0 | 2.1 |
| 1E | 3.10 | 110.8 | 1.9 |
| 1F | 2.14 | 99.6 | 2.0 |

As apparent from Table 1, when the bonding position was located on center line c1 of resonator Rp1, on both sides of center line c1, or on and on both the sides of center line c1 (sample 1C to 1F), the real part of impedance which causes Joule heat was small, whereby the temperature rise of the chip was suppressed. Accordingly, the power withstanding characteristics were raised. Moreover, it was confirmed as a result of an analysis employing a Smith chart, which is not shown in the figure, that the reflection coefficients were increased at the attenuation band so that the interference between the filter characteristics for the transmitting and for the receiving was reduced when used in the antenna duplexer.

Though input and output terminals of the signal are connected respectively via two bonding wires 31 and 32 to signal input terminal T1 or signal output terminal T2 in the first preferred embodiment shown in FIG. 4, a single bonding wire is connected here respectively, so that a comparison examination was actually done to the sample of the structure of prior art, which is not shown in the figure, having a 10 μm width b of the connection electrode and a 70–80 μm width of lead conductor 131-1. As a result, when a single bonding wire 31 and 32 was connected onto each input and output terminal the value of withstanding power was 1.4 W. On the other hand, when respectively two wires were connected to each the value of withstanding power was 1.6 W.

Figure 5:
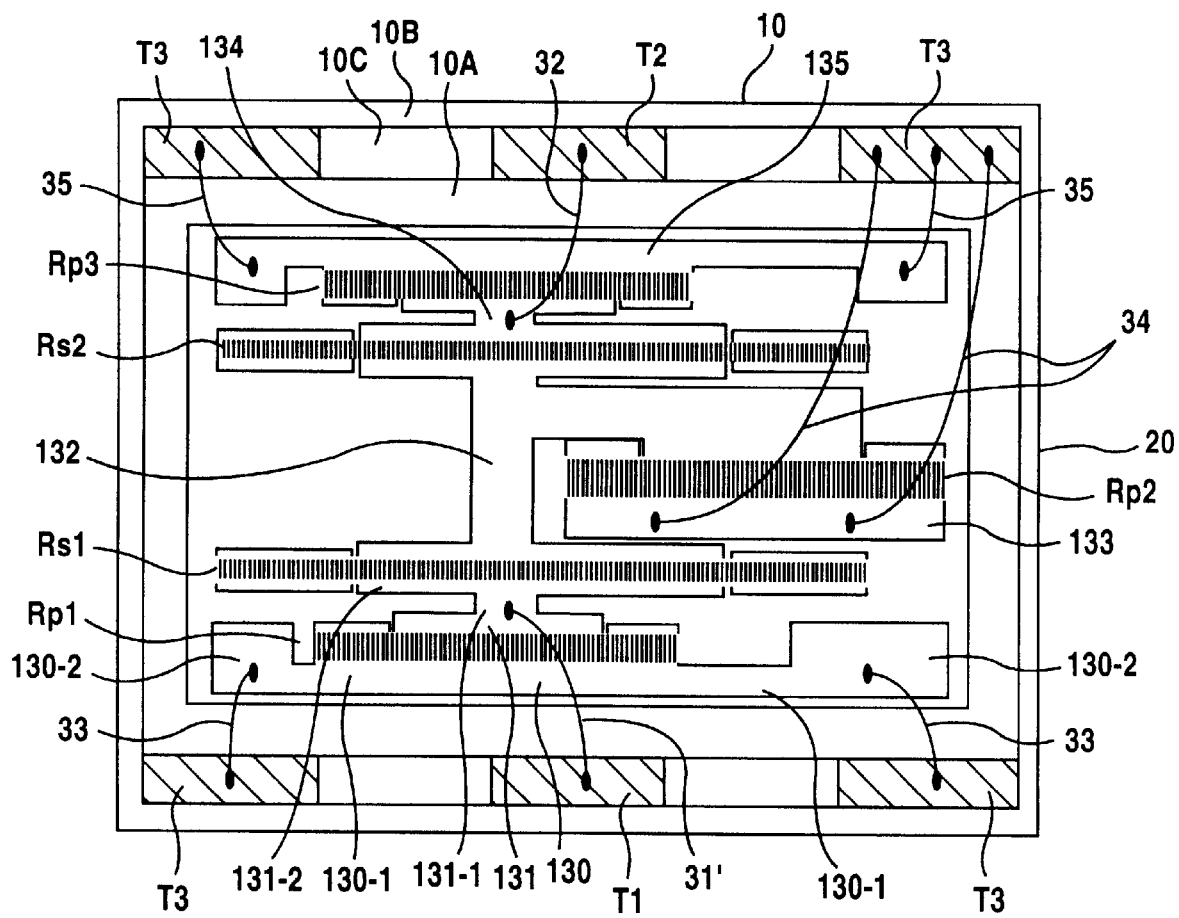
FIG. 5 is a plane view of the second preferred embodiment of the SAW filter of the present invention.
Figure 6A:
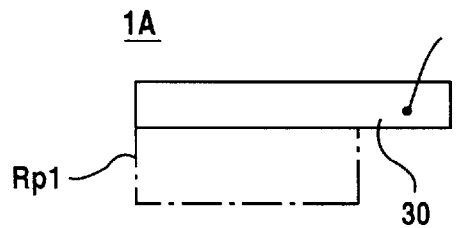
FIGS. 6A, 6B, 6C, 6D, 6E and 6F show figures of the samples in which the positions of the bonding wires to be connected to are varied.
Figure 6B:
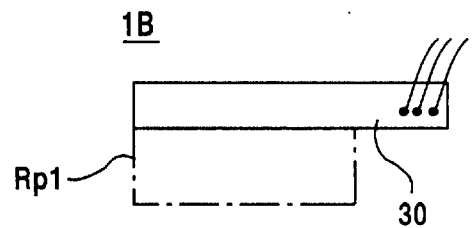
Figure 6C:
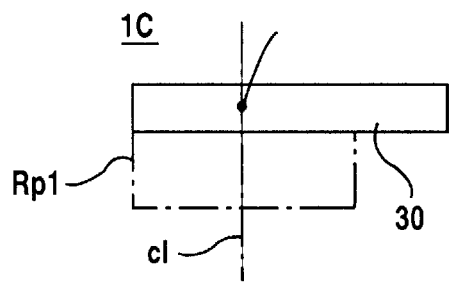
Figure 6D:
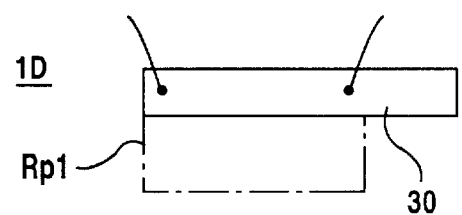
Figure 6E:
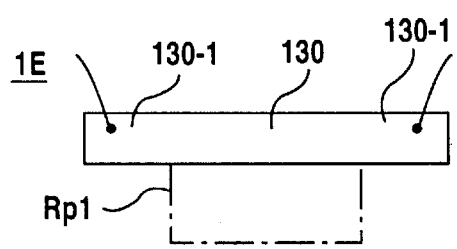
Figure 6F:
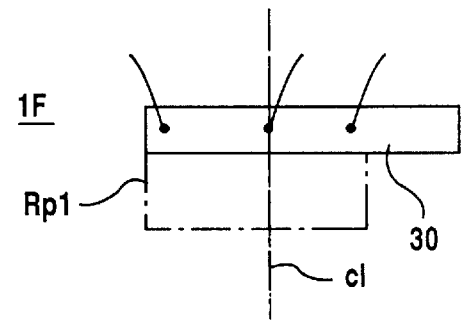

A second preferred embodiment is shown in FIG. 5, where the thin film wiring conductor and the bonding wire of the first preferred embodiment are partially modified. In this preferred embodiment, a single bonding wire 31' is connected from input terminal T1 substantially onto the center of lead conductor 131-1 of the resonator input side. Lead conductor 131-1 is connected with connection electrodes 131 and 131-2 of the parallel and series resonators Rp1 and RS1, respectively. The width of connection electrode 131 is as wide as 20 μm and the width in the direction of length of connection electrode 131 is 100 μm, which occupies about ⅓ of the width of the comb teeth group. Therefore, the current from the connection point of the bonding wire to the comb teeth electrodes is distributed enough, that is, the electrical resistance is low enough.

The structures of the samples 1C, 1D and 1F shown in FIG. 6 are not particularly explained as an independent preferred embodiment; however, because of its clear effect it is needless to say that they can be applied to the lead conductor of the resonator according to the concept and the proof data of the present invention.

Figure 7A:
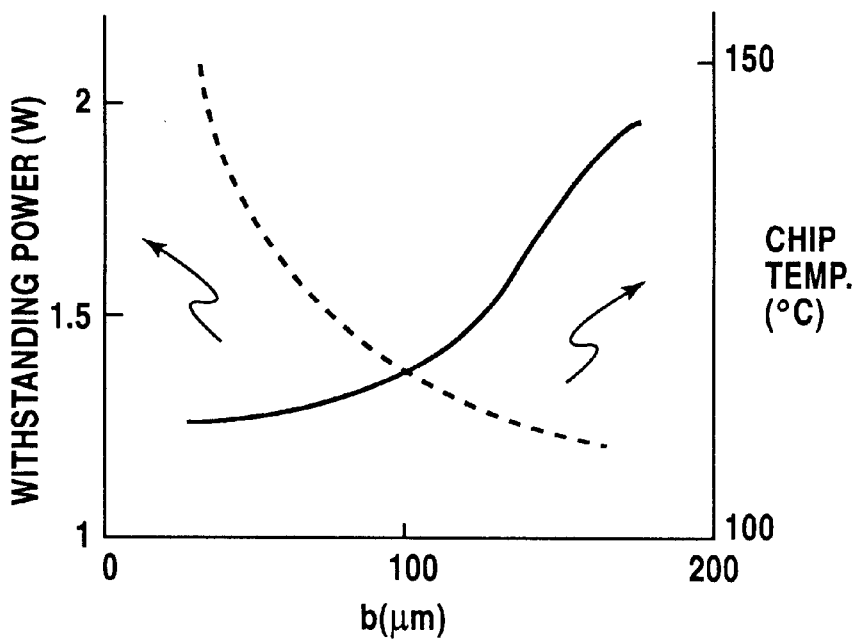
FIGS. 7A and 7B show the temperature and the value of the withstanding power of the chip when the width and the thickness of connection electrode are varied.
Figure 7B:
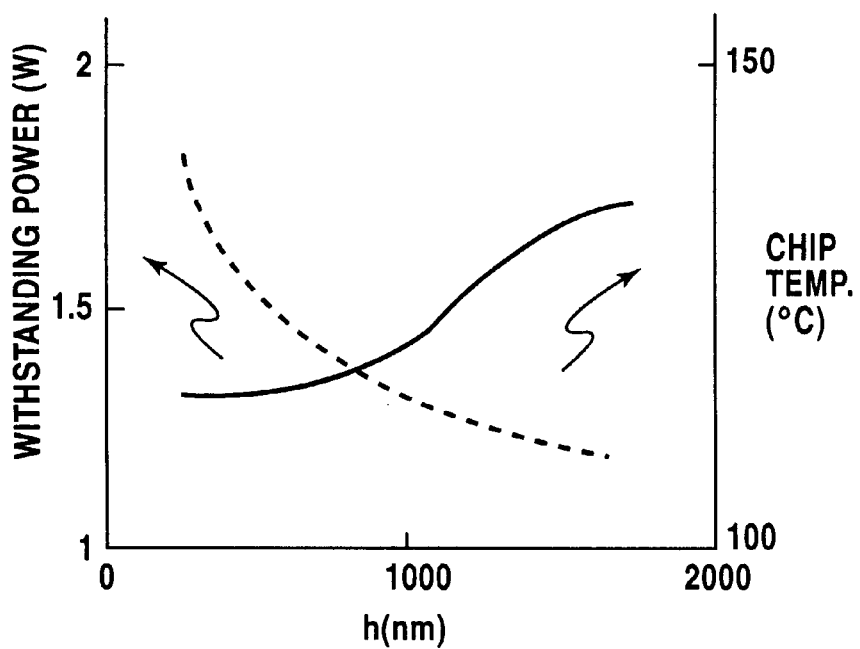

Moreover, data in variation of width b and thickness h of the connection electrode, that is, of the electrical resistance, is shown in FIG. 7A and FIG. 7B in order to confirm the temperature rise of the chip and the power withstanding characteristics. This data was measured on the above-mentioned sample 1A. It is seen that an increase in width b and h in thickness of the connection electrode contributes to the decrease in the temperature rise of the chip as seen from this figure.

Figure 8:
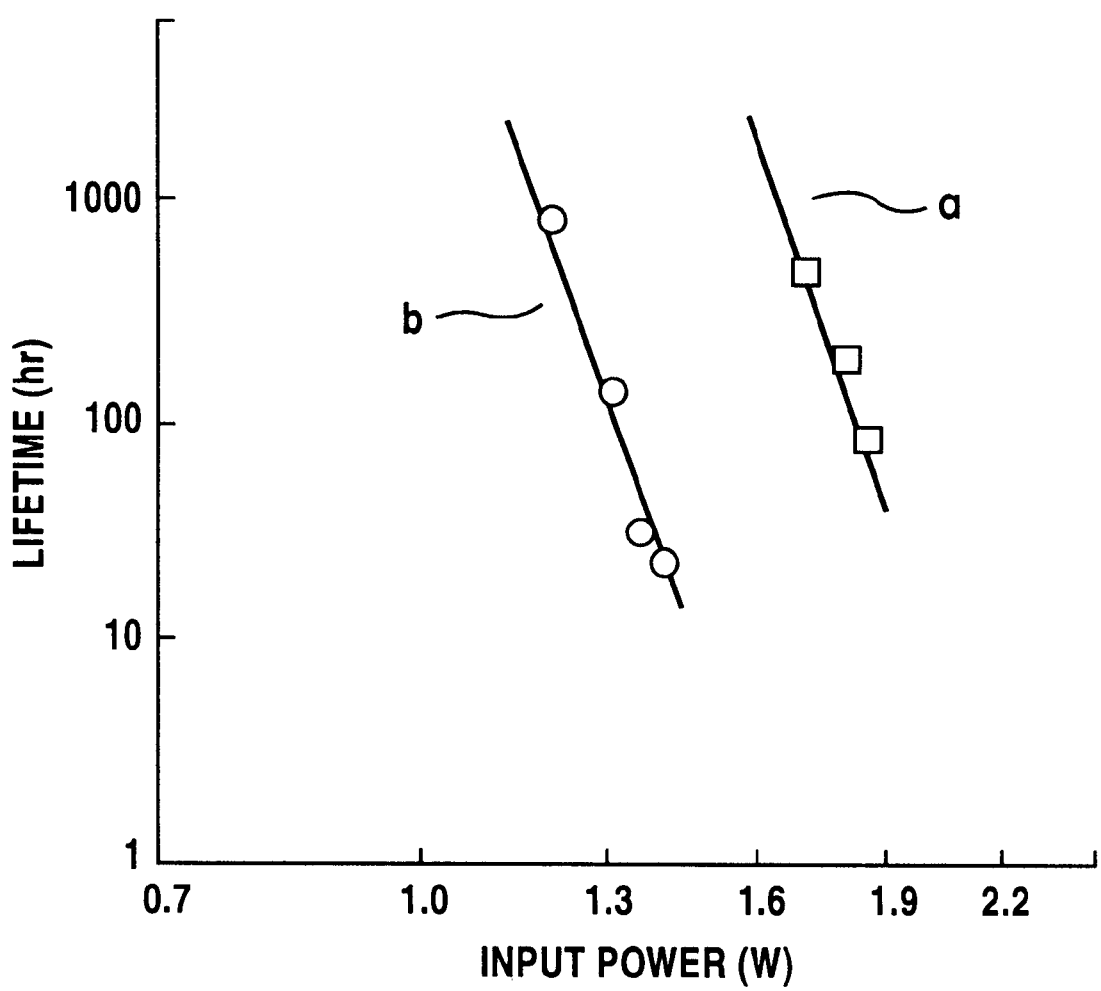
FIG. 8 shows comparison data of the lifetime when the signal input level is varied.

The result of life tests of the filter of the above-mentioned first preferred embodiment and the filter of the prior art technology which uses above-mentioned sample 1B on the earth side of the parallel resonator on the input side is shown in curves a and b of FIG. 8. The horizontal axis of the figure shows the input signal power level. Life tests were carried out respectively on three to four kinds of input signal power levels at the environmental temperature 35° C. as shown in the figure. The input signal frequency is a frequency in the attenuation pole at the lower frequency side of the filter. Judgment of the life time was the same as the condition of the case of Table 1. The line plotted in this figure is extended until intersecting with the 1 W line which is a practical input signal power level, then it was found that the lifetime of the prior art structure was 69,000 hours, and the lifetime of the present invention structure was 24,000,000 hours; thus it was proven that the effect of the present invention was remarkable.

Figure 9:
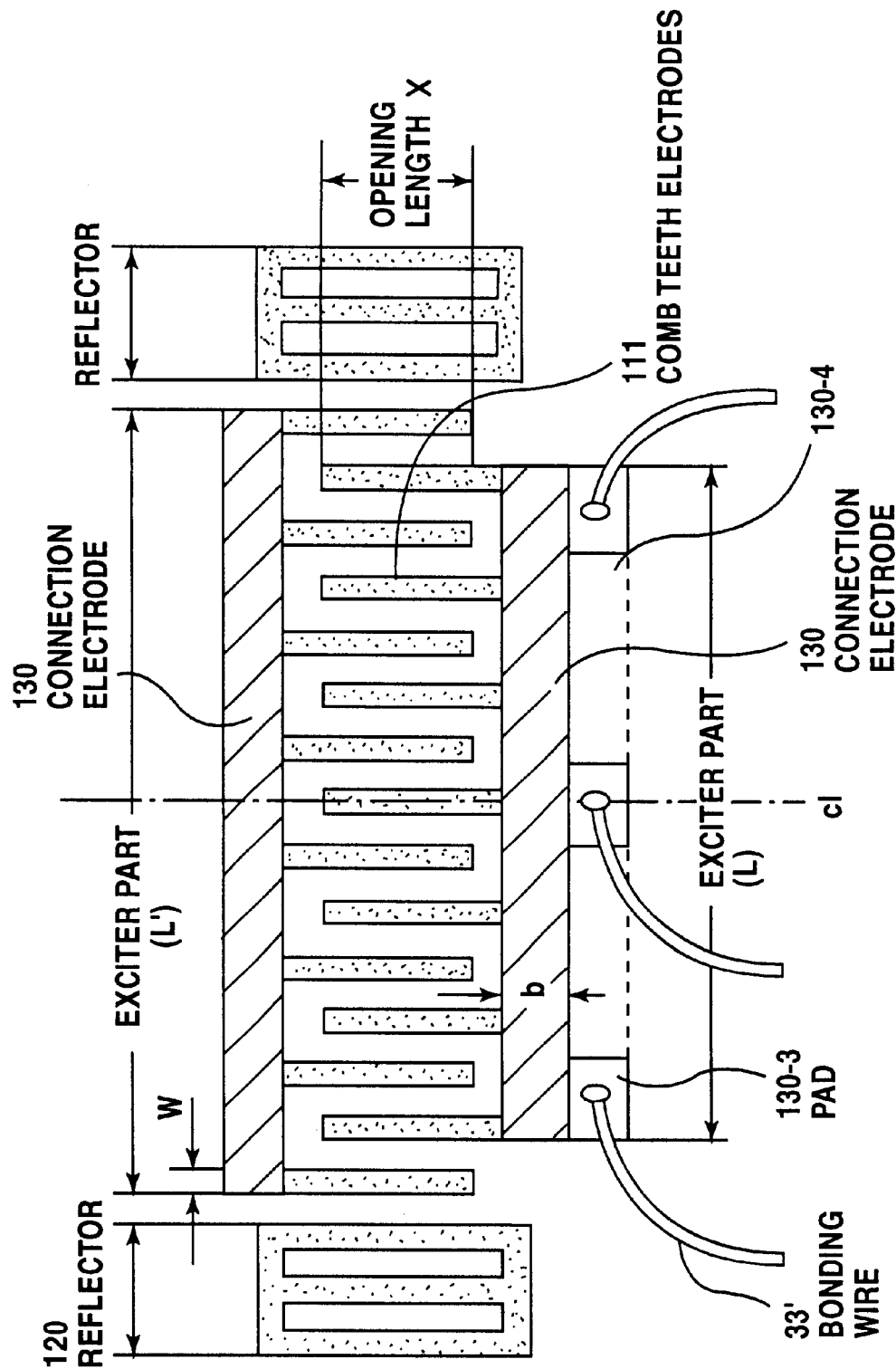
FIG. 9 shows a plane view of the third preferred embodiment of the present invention showing a variation example of the leading out method of the bonding wires.

In the above-mentioned preferred embodiment, the bonding wires were connected onto the connection electrode and onto the lead conductor extended in its longitudinal direction. However, in FIG. 9 is shown as the third preferred embodiment a case where three lead conductors 130-3 are provided in a pad shape projected from a side of the connection electrode opposite to the comb teeth electrodes, and the bonding wires are connected thereto, respectively. In this case, width b of the connection electrode need not necessarily be larger than width w of the comb teeth electrode, and is determined by the shape, the number of lead conductors 130-3, and the thickness, etc. of the connection electrode. It is needless to say that the part 130-4 between pads shown with the dotted line is allowed to be buried though only the portion of the pad is projected from the connection electrode in FIG. 9.

Figure 10:
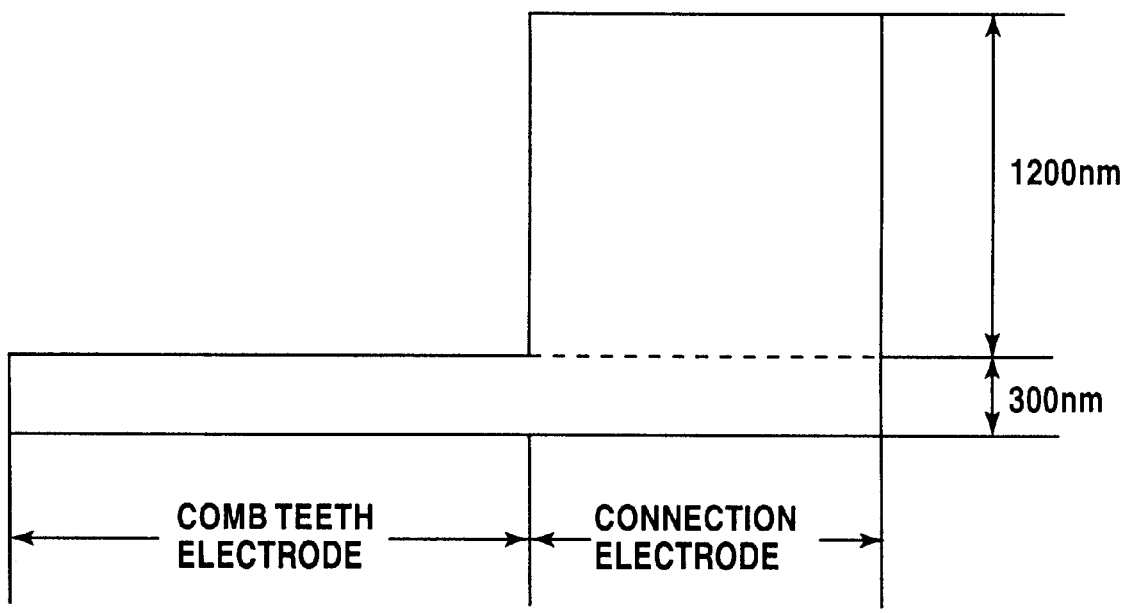
FIG. 10 shows a cross-sectional view of the fourth referred embodiment of the present invention where the thickness of the connection electrode is varied.

Though the area was enlarged as a means for decreasing the electrical resistance the connection electrode in the above-mentioned preferred embodiment, and the welding positions were selected so as to distribute the current in the connection electrode, otherwise is possible to cope therewith by increasing the thickness of the connection electrode as well. This is shown in FIG. 10 as the fourth preferred embodiment. This figure shows a cross-sectional view cut along a comb teeth electrode. The thickness of the connection electrode is 1200 nm while the thickness of the comb teeth electrodes is 300 nm. The number of the bonding wires connected onto the connection electrode is chosen according to the preferred embodiment mentioned above. The effect thereof was described in FIG. 7A and FIG. 7B. Lead conductors may be led out from the connection electrode so that the bonding wires be connected onto the lead conductors. Moreover, the lead conductor may be formed as thick as the connection electrode. The increase of the thickness is performed by adding the patterning process utilizing a lithography method.

Figure 11:
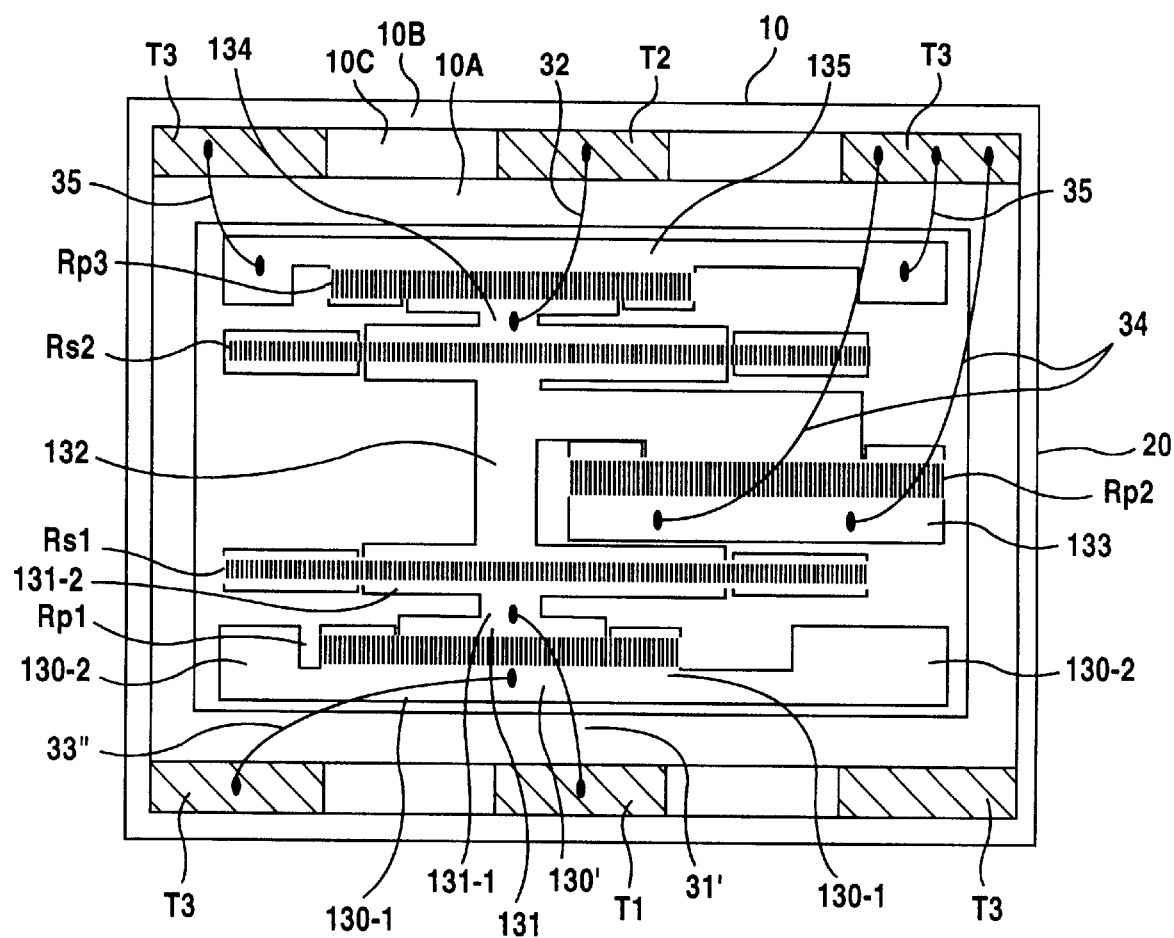
FIG. 11 is a plane view of the fifth preferred embodiment of the present invention where the number of the bonding wire is chosen one.

In FIG. 11 is shown, as the fifth preferred embodiment, a case where a single bonding wire is used at the ground side of the parallel resonator of the input stage. The all except the bonding wire 33" are the same as the second preferred embodiment shown in FIG. 5. Bonding wire 33" is connected onto substantially the central part of connection electrode 130-1. The heat generation is a little as well as the reliability is enough, because width b of connection electrode 130-1 is wide enough as 30 μm as explained previously. The advantage of this structure is in that the number of bonding wires is small. The bonding wires led out respectively from both the sides of electrode 130-1 in the first preferred embodiment have also a purpose of avoiding an interference with input bonding wire 33. However, there is, in the fifth preferred embodiment, also a characteristic effect of covering the surface of the chip with a thin film electrode.

Though there was shown the case where the number of bonding wires was one or two in the above-mentioned preferred embodiment, it is needless to say that the use of three or more bonding wires may be used according to the concept of the present invention. In that case, it is preferable to connect the middle one onto the vicinity of center line c1.

Figure 3A:
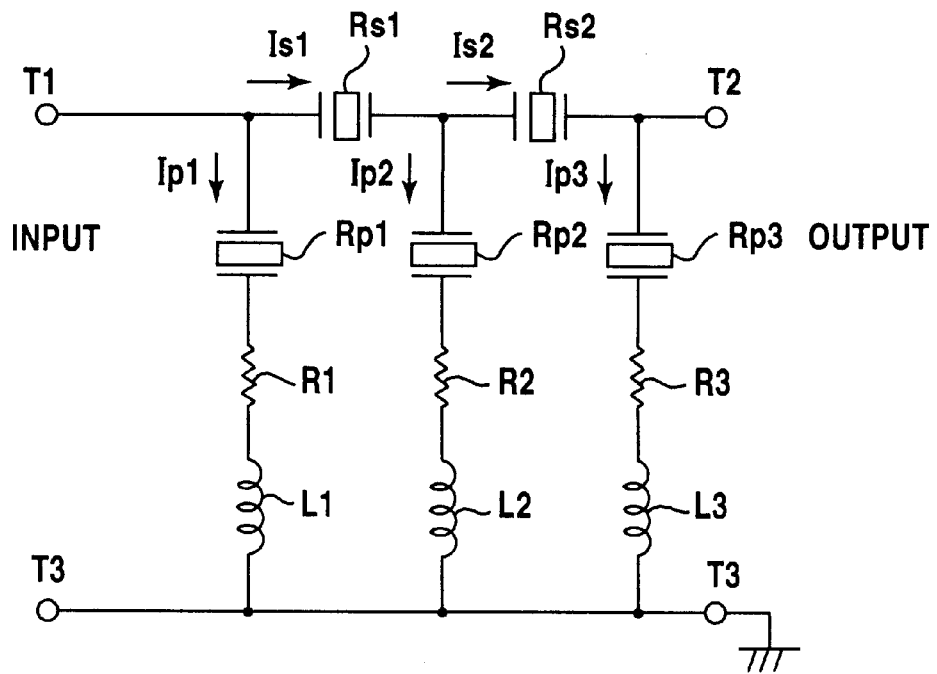
FIGS. 3A and 3B show an equivalent circuit of the SAW filter and resonator.
Figure 3B:
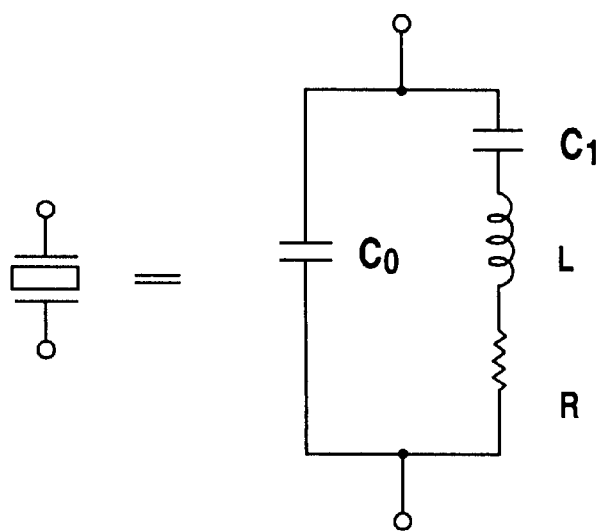

The structure of the filter chip, length and position of the number of bonding wire can be determined while adjusting inductance L1 to L3 shown in the FIG. 3A by suitably selecting the number and the length of the bonding wires to the desirable value and considering the improvement of the filter characteristic at the same time. (Japanese Provisional Patent Publication, No. HEI5-183380, and Japanese Provisional Patent Publication, No. (HEI6-164309).

Moreover, the number of the stages of the ladder, the electrode pattern of each resonator, the arrangement relation of each resonator, the plane pattern of the wiring conductor, the material and thickness of the thin film conductor of the filter chip, and the material of the piezo electric substrate, the structure of the package, the arrangement relation of each terminal T1–3 to filter chip 20, and the material and sizes of bonding wires 31 to 35, etc. can be variously modified.

Because, as previously explained, except in the input/output circuit of parallel arm resonator Rp1 at the input stage, the current value is low compared with resonator Rp1, neither of the welding position nor the wiring form of the bonding wire is severe compared with those in parallel arm resonator Rp1 at the input stage. Which form of the above-mentioned preferred embodiments is to be chosen, that is, the position and the number of bonding wires, is often determined according to an overall judgment on the problem of the adjustment of inductance and the interference with other bonding wires, etc.

It is needless to say that the present invention can be applied to a mere SAW resonator though there was presented in the above-mentioned preferred embodiments the cases where the present invention was applied to SAW filters.

As described above, according to the present invention the heat generation at between the resonator and the bonding wire is reduced so that the temperature rise of the resonator is suppressed; accordingly, the improvements of the power-withstanding characteristics as well as the lifetime can be accomplished, without considerably affecting the filter characteristics of the resonators.

What is claimed is:

1. A surface acoustic wave filter comprising:
   a plurality of parallel arms including a first resonator having a first resonance characteristic and a series arm including a second resonator having a second resonance characteristic having a resonance frequency which is substantially equal to an anti-resonance frequency of said first resonators,
   wherein an input resonator of one of said first resonators of said parallel arm is connected to an input of said surface acoustic wave filter, at least said input resonator including a plurality of comb teeth electrodes each of which has opposing first and second ends, at least a continuous connection electrode directly connecting the first end of each of said plurality of comb teeth electrodes while the second end of each of said plurality of comb teeth electrodes remains electrically open such that each of said plurality of comb teeth electrodes is arranged perpendicular to said continuous connection electrode, and bonding wires connected to said continuous connection electrode at both sides of a center line of said plurality of comb teeth electrodes.

2. A surface acoustic wave filter as recited in claim 1, wherein said connection electrode is provided on a grounding side of said input resonator.

3. A surface acoustic wave filter as recited in claim 1, wherein said connection electrode is provided at an input side of said input resonator.

4. A surface acoustic wave filter as recited in claim 1, wherein a width b, along the longitudinal direction of said comb teeth electrode, of said continuous connection electrode is larger than a width w of said comb teeth electrode.

5. A surface acoustic wave filter as recited in claim 1, further comprising a lead conductor connected to said connection electrode, wherein said bonding wires are connected onto said lead conductor extending along a longitudinal direction of said continuous connection electrode.

6. The surface acoustic wave filter as recited in claim 1, wherein each of said first resonators include first and second groups of comb teeth electrodes, a first connection electrode electrically connecting said first group of comb teeth electrodes, and a second connection electrode electrically connecting said second group of comb teeth electrodes; and
   said center line of said input resonator of said first resonators divides both of said first and second groups of comb teeth electrodes so that an equal number of comb teeth electrodes lie on either side of said center line.

7. A surface acoustic wave device comprising:
   a first resonator, including
   a first plurality of comb teeth electrodes,
   a second plurality of comb teeth electrodes, comb teeth electrodes of said first and second plurality of comb teeth electrodes extending in a lengthwise direction and arranged alternately in an interleaving manner in a widthwise direction,
   a first continuous connection electrode connected directly to each of said first plurality of comb teeth electrodes on a first side of said first plurality of comb teeth electrodes,
   a second continuous connection electrode connected directly to each of said second plurality of comb teeth electrodes on a second side of said second plurality of comb teeth electrodes, opposite said first side, and
   a pair of reflectors arranged at ends of said first and second plurality of comb teeth electrodes,
   wherein at least one of said first and second continuous connection electrodes extends beyond at least one of opposite ends of a corresponding one of said first and second plurality of comb teeth electrodes and extends up to but not alongside said pair of reflectors,
   wherein said first and second continuous connection electrodes have such a width in a direction parallel to the lengthwise direction of each of said first and second plurality of comb teeth electrodes at any place between opposite ends of each of said first and second continuous electrodes in a lengthwise direction that a bonding wire is connectable to a corresponding one of said first and second continuous electrodes.

8. The surface acoustic wave device of claim 7, wherein at least a bonding wire is connected to one of said first and second continuous electrodes substantially on a center line of said first and second plurality of comb teeth electrodes, the center line extending in a direction substantially parallel to the lengthwise direction of electrodes of said first and second plurality of comb teeth electrodes.

9. A surface acoustic wave device comprising:

a first resonator, including a first plurality of comb teeth electrodes, a second plurality of comb teeth electrodes, comb teeth electrodes of said first and second plurality of comb teeth electrodes extending in a lengthwise direction and arranged alternately in an interleaving manner in a widthwise direction, a first continuous connection electrode connected directly to each of said first plurality of comb teeth electrodes on a first side of said first plurality of comb teeth electrodes, a second continuous connection electrode connected directly to each of said second plurality of comb teeth electrodes on a second side of said second plurality of comb teeth electrodes, opposite said first side, wherein at least one of said first and second continuous connection electrodes extends in a lengthwise direction beyond at least one of opposite ends of a corresponding one of said first and second plurality of comb teeth electrodes, wherein said first and second continuous connection electrodes have such a width in a direction parallel to the lengthwise direction of each of said first and second plurality of comb teeth electrodes at any place between opposite ends of each of said first and second continuous electrodes in a lengthwise direction that a bonding wire is connectable to a corresponding one of said first and second continuous electrodes, and wherein at least first and second bonding wires having first ends are connected to one of said first and second continuous connection electrodes at opposite sides of a center line of said first and second plurality of comb teeth electrodes, the center line extending in a direction substantially parallel to the lengthwise direction of electrodes of said first and second plurality of comb teeth electrodes.

10. The surface acoustic wave device of claim 9, wherein each of the first and second bonding wires is connected to one of said first and second continuous connection electrodes at a place inside opposite ends of said first and second plurality of comb teeth electrodes in the widthwise direction.

11. The surface acoustic wave device of claim 9, wherein each of the first and second bonding wires is connected to the one of said first and second continuous connection electrodes at a place outside opposite ends of said first and second plurality of comb teeth electrodes in the widthwise direction.

12. The surface acoustic wave device of claim 9, wherein at least a bonding wire is connected to the corresponding one of said first and second continuous electrodes by jumping over said first and second plurality of comb teeth electrodes in a lengthwise direction of said comb teeth electrodes.

13. A surface acoustic wave device comprising:

a first resonator, including a first plurality of comb teeth electrodes, a second plurality of comb teeth electrodes, comb teeth electrodes of said first and second plurality of comb teeth electrodes extending in a lengthwise direction and arranged alternately in an interleaving manner in a widthwise direction, a first continuous connection electrode connected directly to each of said first plurality of comb teeth electrodes on a first side of said comb teeth electrodes, a second continuous connection electrode connected directly to each of said second plurality of comb teeth electrodes on a second side of said comb teeth electrodes, opposite to said first side, at least first and second bonding wires having first ends connected to said continuous first connection electrode at opposite sides of a center line of said plurality of comb teeth electrodes, the center line extending in a direction substantially parallel to the lengthwise direction of electrodes of said first and second plurality of comb teeth electrodes; and a common external electrode, wherein said first continuous connection electrode does not extend beyond said first plurality of comb teeth electrodes and said second continuous connection electrode does not extend beyond said second plurality of comb teeth electrodes, and wherein second ends of said first and second bonding wires are connected to said common external electrode.

14. The surface acoustic wave device of claim 13, wherein said common external electrode is an input of said surface acoustic wave device.

15. The surface acoustic wave device of claim 13, wherein said common external electrode is grounded.

16. A surface acoustic wave filter comprising:

a plurality of parallel arms each including a first resonator having a first resonance characteristic and a plurality of series arms each connected between each of said parallel arms including a second resonator having a second resonance characteristic having a resonance frequency which is substantially equal to an anti-resonance frequency of said first resonators, wherein one of said second resonators of said plurality of series arms is connected to an input of said surface acoustic wave filter and to an input resonator, at least said input resonator including a plurality of comb teeth electrodes each of which has opposing first and second ends, at least a continuous connection electrode directly connecting the first end of each of said plurality of comb teeth electrodes while the second end of each of said plurality of comb teeth electrodes remains electrically open such that each of said plurality of comb teeth electrodes is arranged perpendicular to said continuous connection electrode, and bonding wires connected to said continuous connection electrode at both sides of a center line of said plurality of comb teeth electrodes.

17. A surface acoustic wave device comprising:

a first resonator, including a first plurality of comb teeth electrodes, a second plurality of comb teeth electrodes, comb teeth electrodes of said first and second plurality of comb teeth electrodes extending in a lengthwise direction and arranged alternately in an interleaving manner in a widthwise direction, a first continuous connection electrode connected directly to each of said first plurality of comb teeth electrodes on a first side of said comb teeth electrodes, a second continuous connection electrode connected directly to each of said second plurality of comb teeth electrodes on a second side of said comb teeth electrodes, opposite to said first side, and at least first and second bonding wires having first ends connected to said continuous first connection electrode at opposite sides of a center line of said plurality of comb teeth electrodes, the center line extending in a direction substantially parallel to the lengthwise direction of electrodes of said first and second plurality of comb teeth electrodes, wherein said first continuous connection electrode does not extend beyond said first plurality of comb teeth electrodes and said second continuous connection electrode does not extend beyond said second plurality of comb teeth electrodes, wherein said first and second bonding wires have second ends connected to an input of said surface acoustic wave device.

18. A surface acoustic wave device comprising:

a plurality of resonators connected in parallel including a first resonator, which includes:

a first plurality of comb teeth electrodes, a second plurality of comb teeth electrodes, comb teeth electrodes of said first and second plurality of comb teeth electrodes extending in a lengthwise direction and arranged alternately in an interleaving manner in a widthwise direction, a first continuous connection electrode connected directly to each of said first plurality of comb teeth electrodes on a first side of said comb teeth electrodes, a second continuous connection electrode connected directly to each of said second plurality of comb teeth electrodes on a second side of said comb teeth electrodes, opposite to said first side, and at least first and second bonding wires having first ends connected to said continuous first connection electrode at opposite sides of a center line of said plurality of comb teeth electrodes, the center line extending in a direction substantially parallel to the lengthwise direction of electrodes of said first and second plurality of comb teeth electrodes, wherein said first continuous connection electrode does not extend beyond said first plurality of comb teeth electrodes and said second continuous connection electrode does not extend beyond said second plurality of comb teeth electrodes.

19. A surface acoustic wave device comprising:

a first resonator, including a first plurality of comb teeth electrodes, a second plurality of comb teeth electrodes, comb teeth electrodes of said first and second plurality of comb teeth electrodes extending in a lengthwise direction and arranged alternately in an interleaving manner in a widthwise direction, a first continuous connection electrode connected directly to each of said first plurality of comb teeth electrodes on a first side of said comb teeth electrodes, a second continuous connection electrode connected directly to each of said second plurality of comb teeth electrodes on a second side of said comb teeth electrodes, opposite to said first side, and at least first and second bonding wires having first ends connected to said continuous first connection electrode at opposite sides of a center line of said plurality of comb teeth electrodes, the center line extending in a direction substantially parallel to the lengthwise direction of electrodes of said first and second plurality of comb teeth electrodes, wherein said first continuous connection electrode does not extend beyond said first plurality of comb teeth electrodes and said second continuous connection electrode does not extend beyond said second plurality of comb teeth electrodes, wherein said first and second bonding wires are connected to said first connection electrode symmetrical with respect to said center line.

20. A surface acoustic wave device comprising:

a first resonator, including a first plurality of comb teeth electrodes, a second plurality of comb teeth electrodes, comb teeth electrodes of said first and second plurality of comb teeth electrodes extending in a lengthwise direction and arranged alternately in an interleaving manner in a widthwise direction, a first continuous connection electrode connected directly to each of said first plurality of comb teeth electrodes on a first side of said comb teeth electrodes, a second continuous connection electrode connected directly to each of said second plurality of comb teeth electrodes on a second side of said comb teeth electrodes, opposite to said first side, first and second bonding wires having first ends connected to said continuous first connection electrode at opposite sides of a center line of said plurality of comb teeth electrodes, the center line extending in a direction substantially parallel to the lengthwise direction of electrodes of said first and second plurality of comb teeth electrodes, and a third bonding wire connected to said first connection electrode, wherein said first continuous connection electrode does not extend beyond said first plurality of comb teeth electrodes and said second continuous connection electrode does not extend beyond said second plurality of comb teeth electrodes.

21. The surface acoustic wave device of claim 20, wherein said third bonding wire is connected to said first connection electrode at a position along said center line.

22. A surface acoustic wave device comprising:

a plurality of resonators connected in series including a first resonator, which includes:

a first plurality of comb teeth electrodes, a second plurality of comb teeth electrodes, comb teeth electrodes of said first and second plurality of comb teeth electrodes extending in a lengthwise direction and arranged alternately in an interleaving manner in a widthwise direction, a first continuous connection electrode connected directly to each of said first plurality of comb teeth electrodes on a first side of said comb teeth electrodes, a second continuous connection electrode connected directly to each of said second plurality of comb teeth electrodes on a second side of said comb teeth electrodes, opposite to said first side, and at least first and second bonding wire having first ends connected to said continuous first connection electrode at opposite sides of a center line of said plurality of comb teeth electrodes, the center line extending in a direction substantially parallel to the lengthwise direction of electrodes of said first and second plurality of comb teeth electrodes, wherein said first continuous connection electrode does not extend beyond said first plurality of comb teeth electrodes and said second continuous connection electrode does not extend beyond said second plurality of comb teeth electrodes.

23. The surface acoustic wave device of claim 22, wherein said first and second bonding wires have second ends connected to an input of said surface acoustic wave device.

24. A surface acoustic wave device comprising:

a series resonator and a parallel resonator, one of which includes a first resonator, including:

a first plurality of comb teeth electrodes, a second plurality of comb teeth electrodes, comb teeth electrodes of said first and second plurality of comb teeth electrodes extending in a lengthwise direction and arranged alternately in an interleaving manner in a widthwise direction, a first continuous connection electrode connected directly to each of said first plurality of comb teeth electrodes on a first side of said comb teeth electrodes, a second continuous connection electrode connected directly to each of said second plurality of comb teeth electrodes on a second side of said comb teeth electrodes, opposite to said first side, and at least first and second bonding wires having first ends connected to said continuous first connection electrode at opposite sides of a center line of said plurality of comb teeth electrodes, the center line extending in a direction substantially parallel to the lengthwise direction of electrodes of said first and second plurality of comb teeth electrodes, wherein said first continuous connection electrode does not extend beyond said first plurality of comb teeth electrodes and said second continuous connection electrode does not extend beyond said second plurality of comb teeth electrodes.

25. The surface acoustic wave device of claim 24, comprising:

a plurality of series resonators connected in series between an input and an output of said surface acoustic wave device, a plurality of parallel resonators connected in parallel between connections of said series resonators and ground, and wherein said plurality of resonators have a resonance frequency substantially equal to an anti-resonance frequency of said plurality of parallel resonators, and said first resonator is one of said plurality of series resonators and said plurality of parallel resonators.

26. The surface acoustic wave device of claim 25, wherein said first resonator is a parallel resonator of said plurality of parallel resonators connected between the input of said surface acoustic wave device and ground.

27. The surface acoustic wave device of claim 26, wherein said first and second bonding wires are connected at a second end of said bonding wires to ground.

* * * * *